United States Patent [19]

Meehan et al.

[11] Patent Number: 4,530,552
[45] Date of Patent: Jul. 23, 1985

[54] ELECTRICAL CONNECTOR FOR INTEGRATED CIRCUIT PACKAGE

[75] Inventors: Robert F. Meehan; William H. Rose; David T. Shaffer, all of Harrisburg, Pa.

[73] Assignee: AMP Incorporated, Harrisburg, Pa.

[21] Appl. No.: 555,257

[22] Filed: Nov. 25, 1983

[51] Int. Cl.³ ............................................. H01R 23/72
[52] U.S. Cl. .................................. 339/17 CF; 29/876; 174/52 FP
[58] Field of Search ...... 339/17 CF, 176 M, 176 MP; 174/52 FP; 29/876, 883, 884

[56] References Cited

U.S. PATENT DOCUMENTS 3,212,047 10/1965 McDonough .................. 339/17 CF

Primary Examiner—Neil Abrams
Attorney, Agent, or Firm—Adrian J. LaRue; Anton P. Ness

[57] ABSTRACT

An electrical connector for electrical connection to conductive members of a ceramic chip carrier comprises first and second dielectric frame members each of which has opposed side members in which electrical terminal posts are secured at spaced intervals with top sections extending above upper surfaces of the side members and bottom sections extending below bottom surfaces of the side members. Rail members extend between respective side members of each of the frame members so that when the frame members are nested together the rail members of one of the frame members are disposed in engagement with the rail members of the other of the frame members. Latching members on each of the frame members latch the frame members together thereby forming a chip carrier-receiving area so that the top sections of the terminal posts can be eletrically connected to respective conductive members when the ceramic chip carrier is positioned within the chip carrier-receiving area.

7 Claims, 7 Drawing Figures

U.S. Patent  Jul. 23, 1985  Sheet 1 of 3  4,530,552
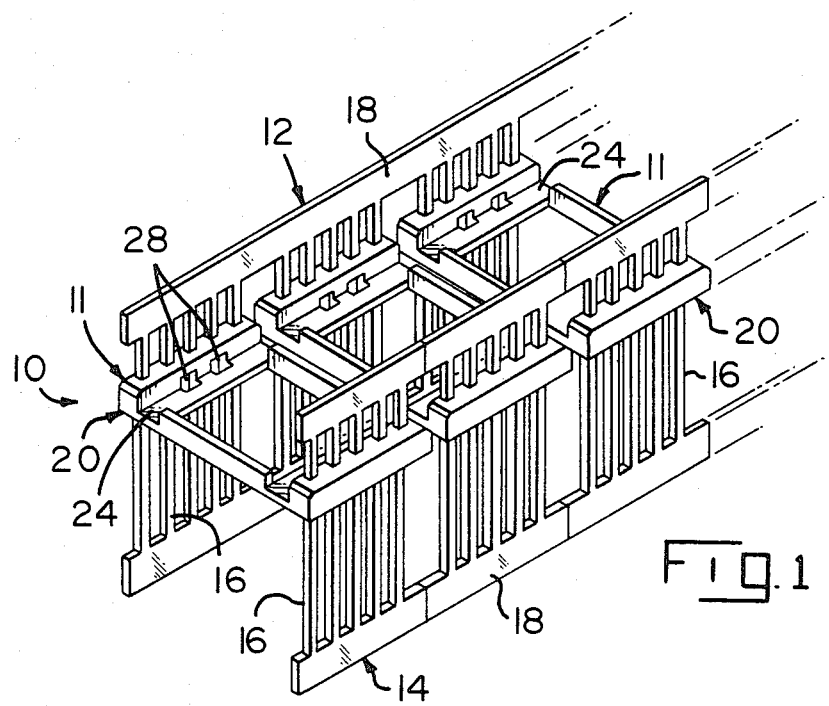
Fig.1
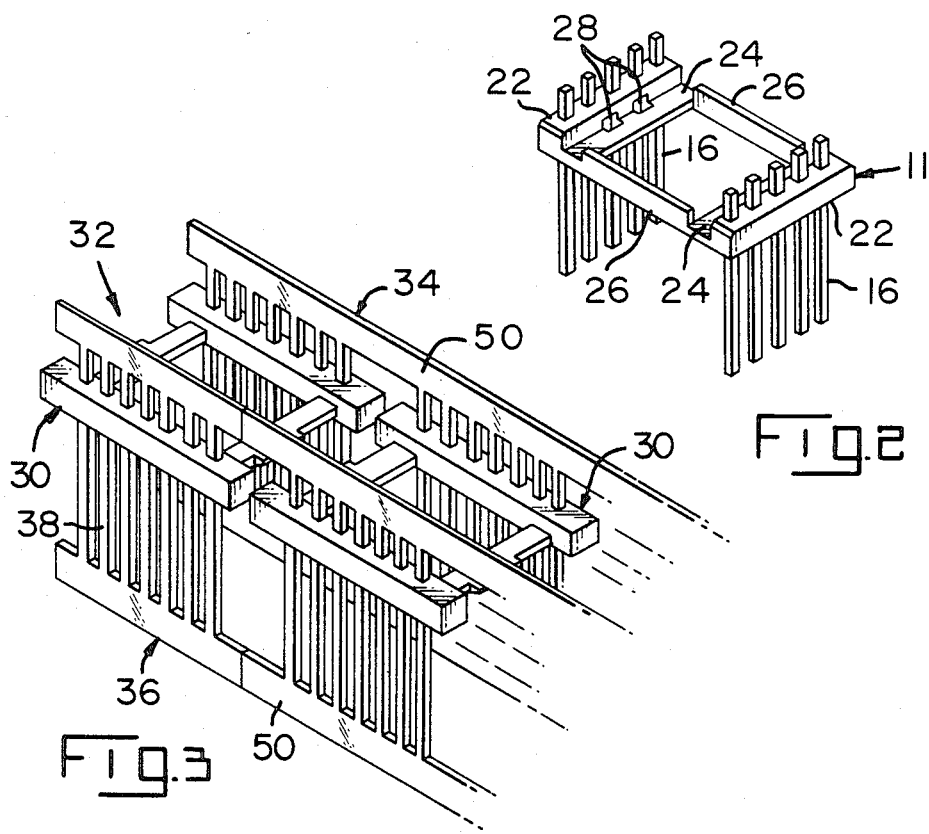
Fig.2
Fig.3

ELECTRICAL CONNECTOR FOR INTEGRATED CIRCUIT PACKAGE

FIELD OF THE INVENTION

This invention relates to electrical connectors and more particularly to electrical connectors for integrated circuit packages and method of making such connectors.

BACKGROUND OF THE INVENTION

Ceramic chip carriers have conductive pads on one surface that extend around the edges of the chip carrier and as conductive coatings into respective grooves in the sides thereof. An integrated circuit chip or die is bonded onto a central cavity area of the ceramic chip carrier and very small diameter wires are connected between the pads of the chip and the chip carrier. Top ends of electrical terminal posts are soldered to conductive coatings in the respective grooves forming a terminated chip package whereafter the bottom ends of the terminated chip package are electrically connected to respective circuit paths on a printed circuit board by flow soldering thereto or within sockets electrically connected to the circuit paths. Such an arrangement is time-consuming and expensive because of the large number and small size of the terminal posts that have to be soldered in the conductive grooves in the sides of the ceramic chip carrier.

SUMMARY OF THE INVENTION

According to the present invention, an electrical connector for electrical connection to conductive members of a ceramic chip carrier comprises first and second dielectric frame members each of which has opposed side members in which electrical terminal posts are secured at spaced intervals with top sections extending above upper surfaces of the side members and bottom sections extending below bottom surfaces of the side members, rail members extend between respective side members of each of the frame members so that when the frame members are nested together the rail members of one of the frame members are disposed in engagement with the rail members of the other of the frame members and latching members on each of the frame members latch the frame members together thereby forming a chip carrier-receiving area so that the top sections of the terminal posts can be electrically connected to respective conductive members when the ceramic chip carrier is positioned within the chip carrier-receiving area. Such an electrical connector can terminate chip carriers that have posts spaced at 0.100, 0.050 or 0.025 inch centers.

According to another aspect of the present invention, a method of making an electrical connector comprises the steps of forming lead frames of electrical terminal posts extending from carrier strips, placing the lead frames in a mold and molding dielectric frame members to a selected number of terminal posts forming one type of electrical terminal frame members and another type of electrical terminal frame members, securing the one and other electrical terminal frame members together thereby forming the electrical connector.

BRIEF DESCRIPTION OF THE DRAWINGS

FIG. 1 is a perspective view of lead frames of electrical terminals with dielectric frame members molded thereto forming a strip of electrical terminal frame members.

FIG. 2 is a perspective view of an electrical terminal frame member separated from the strip and having the carrier strips removed.

FIG. 3 is a perspective view of a strip of other electrical terminal frame members.

DETAILED DESCRIPTION OF THE INVENTION

Figure 4:
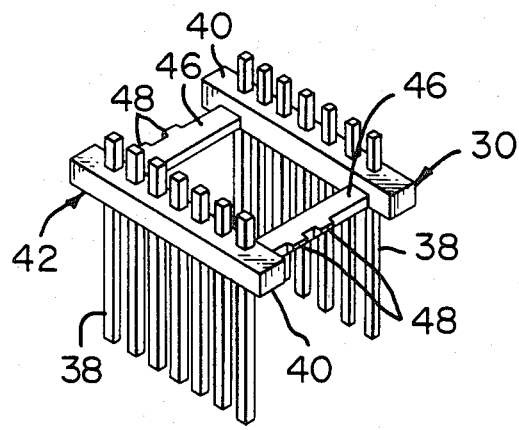
FIG. 4 is a view similar to FIG. 2 showing another electrical terminal frame member removed from the strip and having the carrier strips removed.

FIG. 1 illustrates a continuous strip 10 of electrical terminal frame members 11 which is formed by placing lead frames 12, 14 containing electrical terminal posts 16 extending between carrier strips 18 into a conventional mold so that selected numbers of terminal posts 16 have molded thereto dielectric frame members 20. Lead frames 12, 14 are preferably stamped and formed from metal strips of a suitable metal such as, for example, beryllium copper or the like. Lead frames 12, 14 can also be formed by the conventional practice of chemical etching. Dielectric frame members 20 are molded from a suitable dielectric material. As can be discerned, upper sections of terminal posts 16 extend above the upper surfaces of frame members 20 while bottom sections of terminal posts 16 which are longer than the upper sections extend outwardly from the bottom surfaces of frame members 20. As the continuous strip of electrical terminal frame members 10 are removed from the mold or after they have been removed from the mold, carrier strips 18 of lead frame 14 are cut at the spaces between frame members 20 where no terminal posts 16 are located to enable the strip to be rolled onto a carrier member (not shown).

An electrical terminal frame member 11 is shown in FiG. 2 which has been removed from carrier strips 18. Frame member 20 includes side members 22 in which terminal posts 16 are disposed in spaced relationship. Extensions 24 of side members 22 include rails 26 connecting side members 22 together and recesses 28 are located in each side member 22.

Figure 5:
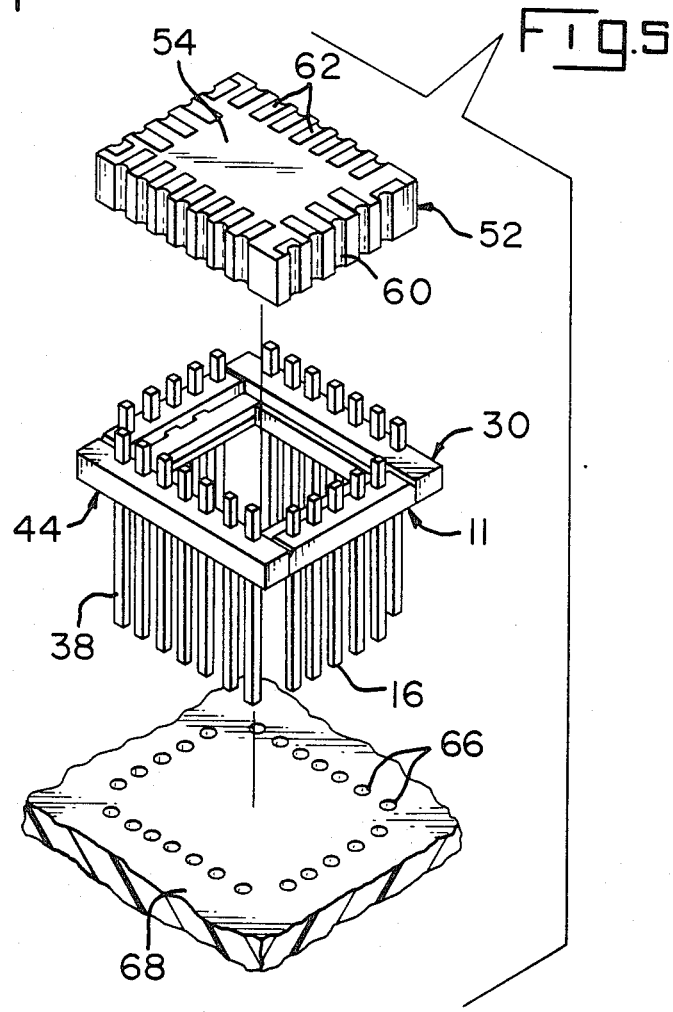
FIG. 5 is a perspective and exploded view showing a ceramic chip carrier with an integrated circuit chip bonded thereto and electrically connected to the circuit pads on the chip carrier, an electrical connector to which the chip carrier is to be electrically connected, and a circuit board on which the connector is to be mounted.

FIG. 3 illustrates electrical terminal frame members 30 in the form of a continuous strip 32 similar to that of continuous strip 10 of FIG. 1 except that lead frames 34, 36 have more terminal posts 38 molded in side members 40 of dielectric frame members 42 of FIG. 4 which have a different configuration than frame members 20 for the reason that electrical terminal frame members 11 are to be latchably secured to electrical terminal frame members 30 to form electrical connectors 44 as shown in FIG. 5. The number of posts 16, 38 secured in frame members 20, 42 will vary in accordance with the type of chip carrier that is to be terminated thereto. Rails 46 connect side members 40 together of dielectric frame members 42 and they have latching projections 48 thereon which have beveled surfaces. An electrical terminal frame member 30 is shown in FIG. 4 with carrier strips 50 of lead frames 34, 36 of FIG. 3 removed therefrom. One of carrier strips 50 is cut at the spaces between frame members 42 where no terminal posts 38 are located to enable the strip to be rolled onto a carrier member in the same manner as that of the strip of FIG. 1.

Figure 6:
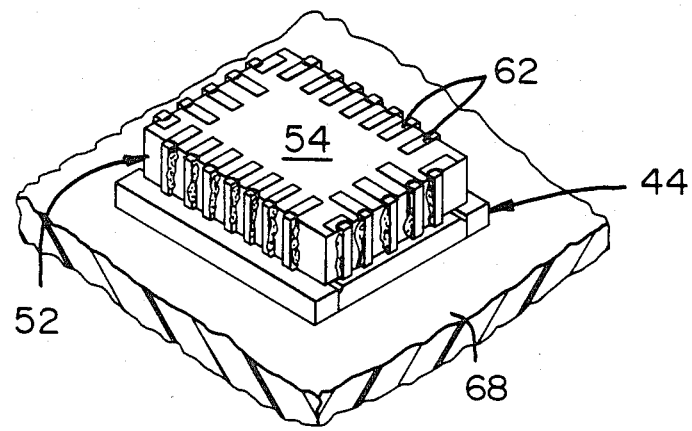
FIG. 6 shows the completed assembly of FIG. 5.
Figure 7:
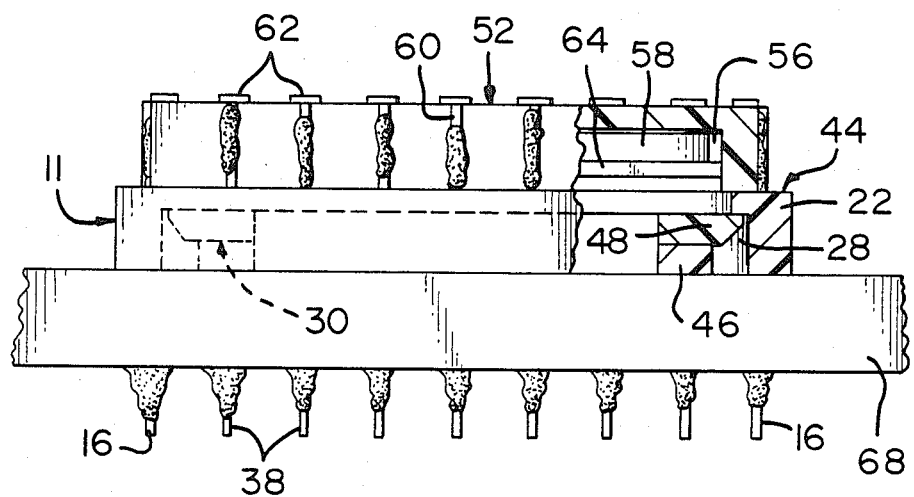
FIG. 7 is a side elevational view partly broken away of FIG. 6.

Electrical terminal frame member 11 and electrical terminal frame member 30 are latchably secured together to form electrical connector 44 by nesting frame member 30 within frame member 11 with rails 46 of frame member 42 extending along respective extensions 24 of frame member 20 and latching projections 48 latchably disposed within recesses 28 thereby latchably securing frame members 11 and 30 together so that the upper surfaces of frame members 20 and 42 are in the same plane and the inner sections of these surfaces inside of the upper sections of posts 16 and 38 define a chip carrier-receiving area on which ceramic chip carrier 52 is disposed as shown in FIGS. 6 and 7. The beveled surfaces of latching projections 48 facilitate the movement thereof into recesses 28.

Ceramic chip carrier 52 comprises a ceramic member 54 which has a cavity 56 therein as shown in FIG. 7. An integrated circuit chip 58 is secured in cavity 56 and is electrically connected to respective circuit paths within cavity 56 and which extend along grooves 60 in the sides of chip carrier 52 and end in pads 62 on the top surface of chip carrier 52. A cap or cover 64 is secured in cavity 56 sealing chip 58 therein.

The terminal posts 16 and 38 while in lead frame form can be coated with reflow solder so that when chip carrier 52 is placed in the chip carrier-receiving area of connector 44 with the upper sections of posts 16 and 38 disposed in respective grooves 60, the upper sections of posts 16 and 38 can be reflow soldered to the conductive paths. The bottom sections of posts 16 and 38 would be disposed in respective holes 66 in printed circuit board 68 and also reflow soldered to respective circuit paths thereon as shown in FIGS. 5-7. Excess lengths of posts 16 and 38 can be trimmed.

Alternatively, posts 16 and 38 while also in lead frame form can be tin plated and chip carrier 52 can be soldered to the upper sections of posts 16, 38 and the bottom sections of the posts can be soldered to the circuit paths of board 68 in accordance with conventional soldering practices such as, for example, wave soldering.

It is to be appreciated that strip 32 and strip 10 can be positioned relative to one another so that when an electrical terminal frame member 30 is positioned over an electrical terminal frame member 11, these frame members can be latched together forming connectors 44. Carrier strips 18 and 50 can be removed as desired.

As can be discerned, an electrical connector is disclosed for terminating the conductive coated grooves in the sides of a ceramic chip carrier which has the grooves spaced at fifty-mil centers.

We claim:

1. An electrical connector for electrical connection to conductive members of a ceramic chip carrier comprising:
   first and second dielectric frame members each of which has opposed side members in which electrical terminal posts are secured at spaced intervals, top sections of the terminal posts extend above upper surfaces of the side members and bottom sections of the terminal posts extend below bottom surfaces of the side members;
   rail members extend between respective side members of each of the frame members enabling the frame members to be nested together so that the rail members of one of the frame members are disposed in engagement with the respective rail members of the other of the frame members with one side member forming each side of a four-sided structure and with all of said side members and rail members being coplanar; and
   latching members on each of the frame members latching the frame members together thereby forming a chip carrier-receiving area so that the top sections of the terminal posts can be electrically connected to respective conductive members when the ceramic chip carrier is positioned within the chip carrier-receiving area.

2. An electrical connector as set forth in claim 1, wherein the side members of the other of the frame members have extensions along which the rail members of the one of the frame members extend.

3. An electrical connector as set forth in claim 1, wherein the latch means comprise recesses in the side members of one of the frame members and latching projections on the rail members of the other of the frame members.

4. An electrical connector, comprising:
   first and second dielectric frame members each of which has opposed side members in which electrical terminals are located at spaced intervals therealong, means extending between respective side members of each of the frame members enabling the frame members to be nested together with one side member forming each side of at least a four-sided structure with all of said side members being coplanar; and
   means on said frame members maintaining said frame members as the four-sided structure so that the electrical terminals can be electrically connected to an electronic component.

5. An electrical connector as claimed in claim 4, wherein said means for enabling the frame members to be nested together comprises rail members.

6. An electrical connector as claimed in claim 5, wherein said rail members of one of the first and second frame members have extensions along which the respective rail members of the other of the first and second frame members extend.

7. An electrical connector as claimed in claim 4, wherein said maintaining means comprise latching means.

* * * * *